United States Patent [19]

Pazos

[11] 4,168,982

[45] Sep. 25, 1979

[54] PHOTOPOLYMERIZABLE COMPOSITIONS CONTAINING NITROSO DIMERS TO SELECTIVELY INHIBIT THERMAL POLYMERIZATION

[75] Inventor: Jose F. Pazos, Claymont, Del.

[73] Assignee: E. I. Du Pont de Nemours and Company, Wilmington, Del.

[21] Appl. No.: 858,352

[22] Filed: Dec. 7, 1977

Related U.S. Application Data

[63] Continuation-in-part of Ser. No. 691,831, Jun. 1, 1976, abandoned, which is a continuation-in-part of Ser. No. 550,660, Feb. 18, 1975, abandoned, which is a continuation-in-part of Ser. No. 324,880, Jan. 18, 1973, abandoned.

[51] Int. Cl.$^2$ .............................. G03C 1/68; C08F 8/18
[52] U.S. Cl. .................................. 96/115 P; 96/35.1; 204/159.18; 204/159.23
[58] Field of Search ................ 96/115 P, 115 R, 35.1; 204/159.18, 159.23

[56] References Cited

U.S. PATENT DOCUMENTS

| | | | |
|---|---|---|---|
| B 367,305 | 3/1976 | Ciurca et al. ............................ | 96/54 |
| 2,927,022 | 3/1960 | Martin et al. ........................... | 96/115 P |
| 2,929,710 | 3/1960 | Martin .................................... | 96/87 R |
| 3,203,801 | 8/1965 | Heiart .................................... | 96/87 R |
| 3,479,185 | 1/1969 | Chambers et al. ...................... | 96/87 R |
| 3,625,696 | 12/1971 | Krauch et al. ........................ | 96/86 P |
| 3,740,224 | 6/1973 | Barzynski et al. ...................... | 96/33 |
| 3,953,444 | 4/1976 | Singh et al. ............................ | 260/350 |

OTHER PUBLICATIONS

Chem. Abstracts, vol. 60, 3121(g), 1964.
Hartel, Chimia, 19, 116–120, 1965.
Tyudesh et al., Kinetics and Catalysts (USSR), 6 pp. 175–181 (1965).
Bluhm et al., Nature, vol. 215, pp. 1478–1479 (1967).

*Primary Examiner*—Jack P. Brammer

[57] ABSTRACT

Thermally stable photopolymerizable compositions comprise (i) at least one nongaseous ethylenically unsaturated compound, (ii) a nitroso dimer which is a noninhibitor of free-radical polymerization but thermally dissociates to nitroso monomer which is an inhibitor of free-radical polymerization, and (iii) an organic, radiation-sensitive free-radical generating system.

8 Claims, No Drawings

PHOTOPOLYMERIZABLE COMPOSITIONS CONTAINING NITROSO DIMERS TO SELECTIVELY INHIBIT THERMAL POLYMERIZATION

CROSS-REFERENCE TO RELATED APPLICATIONS

This is a continuation-in-part of copending application Serial No. 691,831, filed June 1, 1976 now abandoned; which is in turn a continuation-in-part of application Serial No. 550,660, filed February 18, 1975, now abandoned; which is in turn a continuation-in-part of application, Serial No. 324,880, filed January 18, 1973, now abandoned.

BACKGROUND OF THE INVENTION (1) Field of the Invention

This invention relates to photopolymerizable compositions and more particularly to thermally stable compositions containing normally dimeric nitroso compounds.

(2) Description of the Prior Art

It is known that certain aromatic nitroso compounds are useful as polymerization inhibitors. For example, Hungarian Patent 150,550 (1963) describes the use of p-aminonitrosobenzene and α-nitroso-β-naphthol as inhibitors for the free radical polymerization of styrene. It is also known that N-nitrosocyclohexylhydroxylamine salts serve as thermal polymerization inhibitors in the preparation of photopolymers (U.S. Pat. No. 3,625,696, 12/7/71). Similarly, the use of 4-nitrosophenol, 1,4-dinitrosobenzene, nitrosoresorcinol, p-nitrosodimethylaniline and other nitroso compounds as inhibitors for styrene and vinyl acetate polymerizations is described by Hartel, in Chimia (Aarau), 19, p. 116 (1965); and Tyudesh et al., in Kinetics and Catalysis (USSR), 6, p. 175–181 (1965). Heiart in U.S. Pat. No. 3,203,801 describes the use of N-substituted p-nitrosoanilines as sensitometric modifiers in photopolymerization systems. Unfortunately, when these nitroso compounds are used in photopolymerizable compositions, they inhibit the photopolymerization reaction as well as the thermally-induced polymerization reaction.

It is also known that aliphatic nitroso dimers can be dissociated to nitroso monomers, either thermally or by irradiation with short wavelength ultraviolet radiation (Bluhm and Weinstein, Nature, 215, p. 1478, 1967).

SUMMARY OF THE INVENTION

The present invention provides a photopolymerizable composition which is inhibited against thermally-induced free-radical polymerization without significant inhibition of the photopolymerization reaction. The thermally stable photopolymerizable composition of this invention comprises (i) at least one nongaseous ethylenically unsaturated compound capable of polymerization by free-radical initiated chain propagation;

(ii) about 20 parts per million to about 10% by weight, based on the total weight of the photopolymerizable composition, of a nitroso dimer containing a dinitroso group of the structure

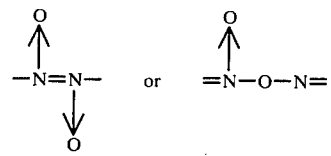

which is a noninhibitor of free-radical polymerization but thermally dissociates to nitroso monomer which is an inhibitor of free-radical polymerization, and is characterized by (a) a dissociation constant of about $10^{-2}$–$10^{-10}$ in solution at 25° C. and (b) a rate of dissociation having a half-life of at least about 30 seconds in solution at 25° C.; and (iii) an organic, radiation-sensitive free-radical generating system activatable by actinic radiation that does not dissociate the nitroso dimer to nitroso monomer.

DESCRIPTION OF THE PREFERRED EMBODIMENTS

The present invention is based on the discovery that nitroso dimers which thermally dissociate to active inhibiting nitroso monomers are not themselves free-radical polymerization inhibitors. A small amount of the nitroso dimer in the photopolymerizable compositions of this invention dissociates under equilibrium conditions to nitroso monomer which is a polymerization inhibitor. Thus, nitroso dimer which is a noninhibitor is the source of the polymerization inhibitor.

The particular nitroso dimer and its concentration in the composition is selected so that the resultant small concentration of nitroso monomer present in the composition is sufficient to inhibit polymerization that can arise during normal storage and handling, for example, at 25° C., and thereby extend the shelf life of the compositions. If, however, the composition is exposed to higher temperatures during such storage or handling or in processing, the dissociation of nitroso dimer to nitroso monomer increases thereby supplying an increasing concentration of inhibitor (monomer) which prevents thermally-induced free-radical polymerization of the composition. The effectiveness of the dimer, as the inhibitor source, is enhanced by the fact that the dimer/monomer equilibrium supplies more inhibitor as the nitroso monomer is used up in preventing the thermally-induced polymerization.

The advantage of using nitroso dimer as the inhibitor source over the direct use of nitroso monomer or other conventional inhibitors in the photopolymerization composition is that inhibition against thermally-induced polymerization is not at the expense of the photopolymerizability of the composition. The dissociation constant and rate of dissociation of the nitroso dimers is such that the amount of nitroso monomer present at the normal temperature of 25° C. is small. This small amount of nitroso monomer is scavenged from the composition during exposure to radiation and the photopolymerization reaction is not necessarily inhibited. To the contrary, surprisingly, in some compositions, the nitroso dimer seems to accelerate the photopolymerization reaction.

The stabilized compositions of this invention include compositions of the unsaturated compound/binder type, and also the substantially dry, predominately crystalline photopolymerizable compositions described by Hertler in Belgian Patent No. 769,694 which contain a solid ethylenically unsaturated monomer.

A. The Unsaturated Component

Suitable free-radical initiated, chain propagating addition polymerizable, ethylenically unsaturated compounds for use in this invention are described, for example, in Burg et al., U.S. Pat. Nos. 3,060,023; Martin et al., 2,927,022; Burg, 3,043,805; Martin, 2,929,710; Cohen et al., 3,380,831; and Hertler, Belgian Patent No. 769,694. They are preferably monomeric, have a boiling point above about 90° C. at normal atmospheric pressure, and contain at least one terminal ethylenic group, but may contain a plurality, such as 2-5 terminal ethylenic groups.

Preferably most of the ethylenic groups are conjugated with a doubly bonded carbon, including carbon doubly bonded to carbon and to such heteroatoms as nitrogen, oxygen and sulfur. Outstanding are such materials wherein the ethylenically unsaturated groups, especially the vinylidene groups, are conjugated with ester or amide structures. Another outstanding class of these preferred addition polymerizable components are the esters and amides of α-methylene carboxylic acids and substituted α-methylene carboxylic acids with polyols and polyamines wherein the molecular chain between the hydroxyls and amino groups is solely carbon or oxygen-interrupted carbon.

In addition, polymerizable, ethylenically unsaturated polymers may be used alone or mixed with other materials. Acrylic and methacrylic esters of polyhydroxy compounds such as pentaerythritol and trimethylolpropane, and acrylic and methacrylic esters of adducts of ethylene oxide and polyhydroxy compounds are also useful.

Suitable unsaturated compounds include unsaturated esters of polyols, particularly such esters of α-methylenecarboxylic acids, e.g., ethylene glycol diacrylate, diethylene glycol diacrylate, glycerol diacrylate, glyceryl triacrylate, mannitol polyacrylate, sorbitol polyacrylates, ethylene glycol dimethacrylate, 1,3-propanediol dimethacrylate, 1,2,4-butanetriol trimethacrylate, trimethylolpropane triacrylate, triethylene glycol diacrylate, 1,4-cyclohexanediol diacrylate, 1,4-benzenediol dimethacrylate, pentaerythritol di-, tri-, and tetramethacrylate, dipentaerythritol polyacrylate, pentaerylthritol, di-, tri-, and tetraacrylates, 1,3-propanediol diacrylate, 1,5-pentanediol dimethacrylate, the bis-acrylates and methacrylates of polyethylene glycols of molecular weight 200-4000, and the like; unsaturated amides, particularly those of α-methylenecarboxylic acids, and especially those of α,(1)-diamines and oxygen-interrupted (ω-diamines, such as methylene bis-acrylamide, methylene bis-methacrylamide, ethylene bis-methacrylamide, 1,6-hexamethylene bis-acrylamide, bis(γ-methacrylamidopropoxy)ethane, β-methacrylamidoethyl methacrylate; vinyl esters such as divinyl succinate, divinyl adipate, divinyl phthalate, divinyl terephthalate, divinyl benzene-1,3-disulfonate and divinyl butane-1,4-disulfonate; styrene and derivatives thereof; unsaturated aldehydes, such as hexadienal; and the like.

A preferred group of monomers, because of the good physical properties of compositions containing them, include:

N-phenyl-N-methylacrylamide,
N-vinylphthalimide,
diacetone acrylamide,
N-vinylsuccinimide,
p-xylylene diacrylate,
1,4-bis(2-acryloxyethyl)benzene
pentaerythritol triacrylate,
4-acryloxybenzophenone,
4-methacryloxybenzophenone,
N-(2-acryloxyethyl)succinimide,
trimethylolpropane triacrylate,
polyoxyethylated trimethylolpropane triacrylate,
pentaerythritol tetraacrylate,
triethylene glycol diacrylate,
triethylene glycol dimethacrylate,
trimethylolpropane trimethacrylate,
4-acryloxydiphenylmethane,
N-(2-acryloxypropyl)succinimide,
2,4-diacryloxybenzophenone,
4-(α,α-dimethylbenzyl)phenyl acrylate,
3-acryloxybenzophenone,
2-acryloxybenzophenone,
2-acryloxy-4-octyloxybenzophenone, and mixtures thereof.

Suitable polymers binders for use in an unsaturated compound/binder system are described by Chang in U.S. Pat. No. 3,661,588, and include such polymeric types as (a) copolyesters based on terephthalic, isophthalic, sebacic, adipic and hexahydroterephthalic acids; (b) nylons or polyamides; (c) vinylidene chloride copolymers; (d) ethylene/vinyl acetate copolymers; (e) cellulosic ethers; (f) polyethylene; (g) synthetic rubbers; (h) cellulose esters; (i) polyvinyl esters including polyvinyl acetate/acrylate and polyvinyl acetate/methacrylate copolymers; (j) polyacrylate and α-alkylpolyacrylate esters, e.g., polymethyl methacrylate, polyethyl methacrylate, and polymethyl methacrylate/ethylacrylate copolymers; (k) high molecular weight polyethylene oxides of polyglycols having average molecular weights of about 4000-1,000,000; (l) polyvinyl chloride and copolymers; (m) polyvinyl acetal; (n) polyformaldehydes; (o) polyurethanes; (p) polycarbonates; (q) polystyrenes. A preferred group of binders includes the polyacrylates and α-alkylacrylate esters, particularly polymethyl methacrylate and polymethylmethacrylate/ethylacrylate copolymers. When a binder system is employed, the binder is normally employed in concentrations of about 3-95% by weight, based on the total composition, and preferably about 25-75% by weight.

When the substantially dry, predominantly crystalline system, described in the Hertler Belgian Patent is employed, in one aspect of the invention, the system may contain in addition to the unsaturated compound, about 0.01-0.25 part by weight, per part of unsaturated compound, of a nonpolymeric, normally liquid organic compound which does not inhibit polymerization of the unsaturated compound and does not absorb so much of the incident radiation as to prevent the initiation of the polymerization by the free-radical generating system. In another aspect of the invention, about 0.01-250 parts by weight, per part of unsaturated compound, of a nonpolymerizable, crystalline organic solid which does not inhibit polymerization of the unsaturated compound and also does not absorb the incident radiation to such an extent as to prevent the initiation of the polymerization by the free-radical generating system may be added.

Illustrative examples of suitable liquid and solid compounds which may be added include octadecanol, triethanolamine, stearic acid, cyclododecane, 1,10-decanediol, dimethylaminobenzonitrile, acetone oxime, desoxybenzoin, naphthalene, N,N'-dimethylhexamethylenediamine, p-diethoxybenzene, biphenyl, dotriacontane, tetramethylurea, tributylamine, 2-dimethylaminoethanol, bibenzyl, pentamethylbenzene, 1,12-dodecanediol, 1,2-diphenoxyethane, octacosane, trichloroxylene, cyclododecanol, and the like. A preferred group of solid compounds includes bibenzyl, biphenyl, 1,2-diphenoxyethane, p-diethoxybenzene, octacosane, 1-octadecanol and cyclododecanol.

B. The Nitroso Dimer

The photopolymerizable composition also contains a nitroso dimer containing a dinitroso group of the structure

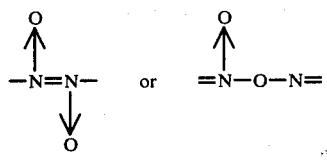

which is a noninhibitor of free-radical polymerization but thermally dissociates to nitroso monomer which is an inhibitor of free-radical polymerization. The structure of the remainder of the compound is not important provided it does not contain groups which inhibit free-radical polymerization. The actual configuration of the dinitroso group of the first structure, whether cis or trans, is immaterial, but the configuration is believed to be mainly trans except when constrained to the cis configuration by a ring structure.

The dinitroso group of the dimer is stable to free radicals, but does thermally and photochemically dissociate to nitroso monomer having one or more -NO groups. It is the -NO group(s) in the monomer that is reactive to free radicals to consume them. Thus, it is apparent that the organic groups satisfying the valences of the dinitroso group and the organic group present in the nitroso monomer are not critical. The organic groups bonded to the nitroso dimer group do determine the dissociation constant and/or dissociation rate of the dimer to nitroso monomer. Once in the monomer form, however, it is the presence of the -NO group only that is important. As such one merely chooses the organic groups that give the dissociation character desired for the dimer.

Nitroso dimers for use in the present invention generally have a dissociation constant, in solution at 25° C., of about $10^{-2}$-$10^{-10}$ and also dissociate relatively slowly, that is have a rate of dissociation at the use temperature which is comparable with the rate of polymerization of the unsaturated compound, and more specifically have a half-life for dissociation at the use temperature of at least about 30 seconds and preferably at least about 1 minute. The dissociation half-life of the dimer can be determined using known techniques, for example, by measuring the rate of colored nitroso monomer formation by visible spectroscopy.

A typical nitroso dimer of the first structure thermally dissociates in accordance with the equation:

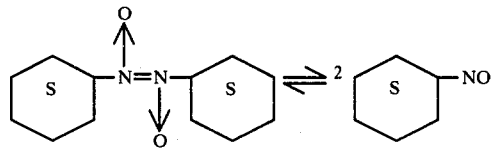

The nitroso monomer may contain one or more nitroso groups. When the nitroso monomer contains two or more nitroso groups, the association of the nitroso groups in the nitroso dimer may be intramolecular rather than intermolecular.

A typical nitroso dimer of the first structure having an intramolecular association of the nitroso groups thermally dissociates in accordance with the equation:

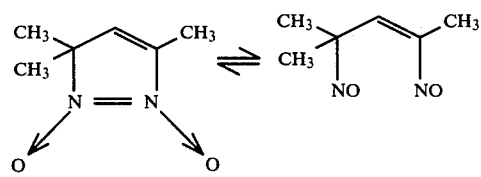

A typical nitroso dimer of the second structure thermally dissociates in accordance with the equation:

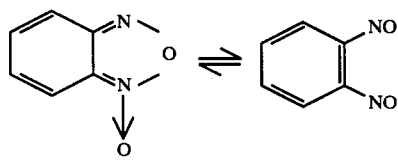

In general, nitroso dimers have nitroso groups attached to primary or secondary aliphatic or alicyclic carbon atoms, and some aliphatic or alicyclic nitroso compounds wherein the nitroso group is attached to a tertiary carbon atom are suitable. Also suitable are certain nitroso dimers in which at least one of the nitrogen atoms, in the noninhibitor or inhibitor form, is attached to a 6-membered aromatic ring or to the beta carbon of a vinyl group attached to a 6-membered aromatic ring. These compounds are referred to herein, for simplicity, as aromatic nitroso dimers.

Suitable examples of nitroso dimers include:

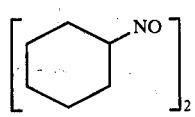

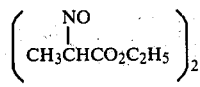

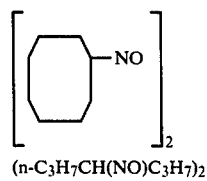

(n-C$_3$H$_7$CH(NO)C$_3$H$_7$)$_2$

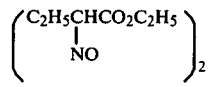
(n-C₄H₉CH(NO)CO₂C₂H₅)₂
((CH₃)₂CHCH₂CH₂CH(NO)CO₂C₂H₅)₂
(C₂H₅O₂CCH₂CH(NO)CO₂C₂H₅)₂
(CH₃COCH(CO₂C₂H₅)CH(NO)CO₂C₂H₅)₂
(CH₃COCH(NO)COC₆H₅)₂
(C₆H₅COCH(NO)COC₆H₅)₂
(p-CH₃OC₆H₄COCH(NO)COC₆H₅)₂
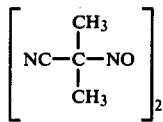
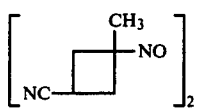
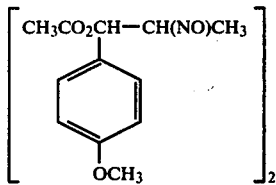
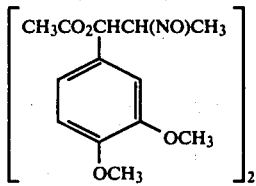
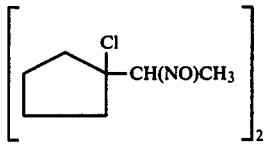
(n-C₄H₉CH(NO)CH₂CH₂CH₂OH)₂
(n-C₆H₁₃CH(NO)CH₃)₂
-continued
((CH₃)₂CHNO)₂
(CH₃CH(NO)C₂H₅)₂
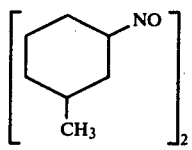
((CH₃)₂CHCH(NO)CH₃)₂
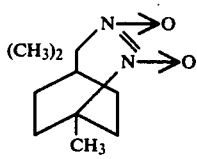
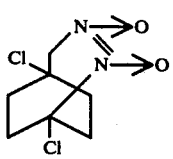
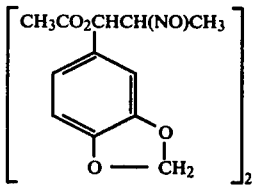
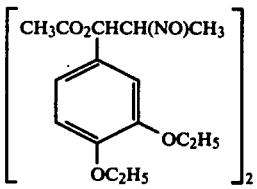
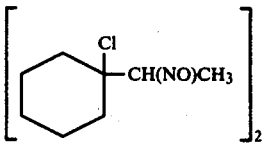
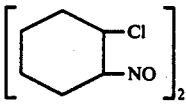
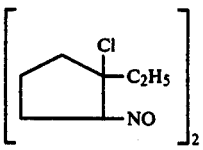
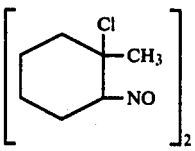

(CH₃CH(NO)Cl)₂
(HO(CH₂)₆NO)₂
((CH₃)₃CCH₂CH(NO)C(CH₃)₂ONO₂)₂
(CH₃CH(Cl)CH(NO)CH₃)₂
(CH₃CH(Cl)CH(NO)C₂H₅)₂
(C₆H₅CH(Cl)CH(NO)CH₃)₂
((CH₃)₂C(Cl)CH(NO)CH₃)₂
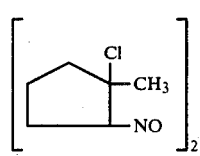
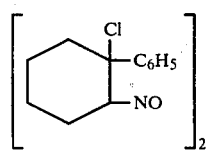
((CH₃)₂CHCOC(CH₃)(NO)CH₃)₂
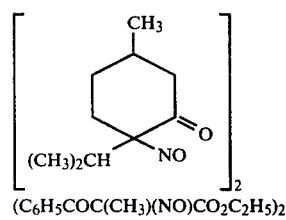
(C₆H₅COC(CH₃)(NO)CO₂C₂H₅)₂
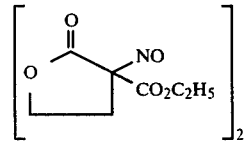
(CH₃C(CH(CH₃)₂)₂CH₂NO)₂
(CH₃(CH₂)₁₆CH₂NO)₂
(CH₃(CH₂)₁₀CH₂NO)₂
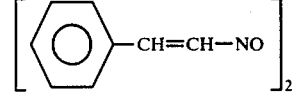
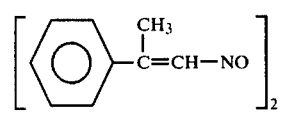
-continued
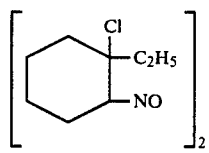
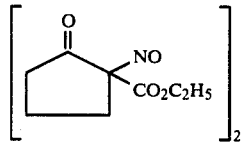
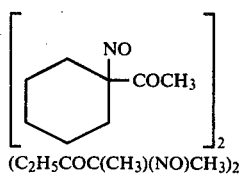
(C₂H₅COC(CH₃)(NO)CH₃)₂
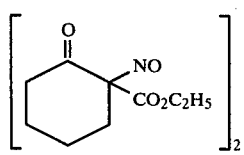
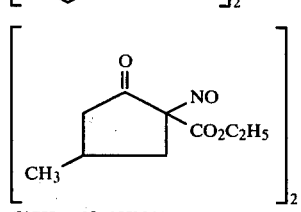
([(CH₃)₃C]₂CHNO)₂
(CH₃NO)₂
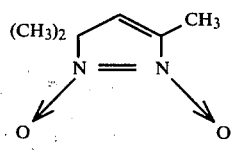
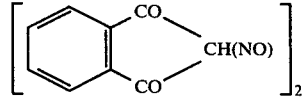
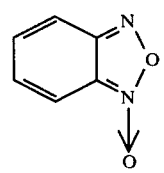

-continued
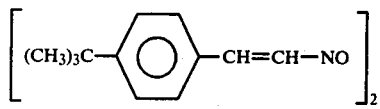
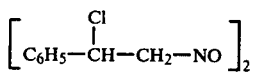
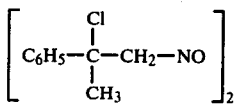
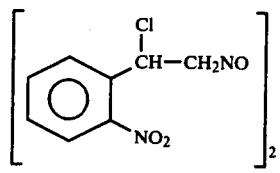
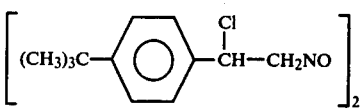
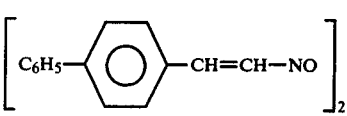
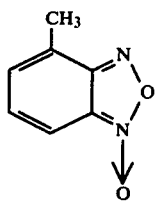
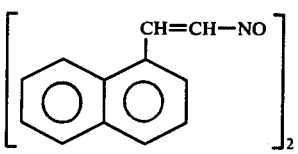
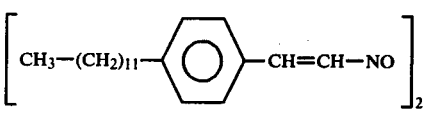
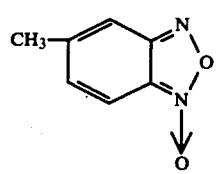
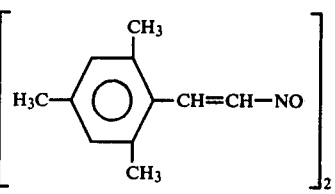
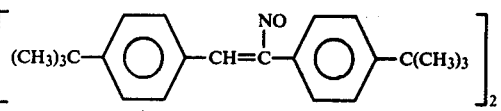
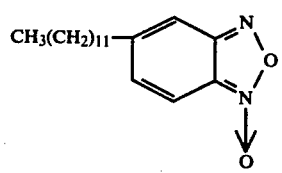
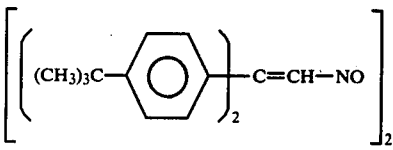
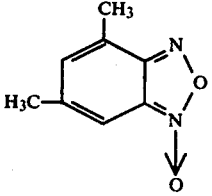
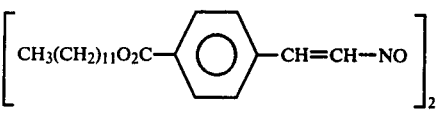

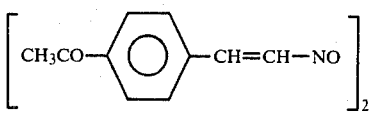

As noted heretofore very small concentrations of nitroso dimer are effective. As little as about 20 parts per million by weight produce an effect. The concentration employed for practical application will generally be greater than this and will depend on the particular unsaturated compound/initiator system employed. With binder systems the concentration is generally between about 100 parts/million by weight and about 2% by weight, based on the total weight of the photopolymerizable composition. When the essentially crystalline systems described by Hertler, supra, are employed, somewhat higher concentrations, generally about 0.1–10% by weight of the photopolymerizable composition, are used. The concentrations of nitroso dimer disclosed herein are based on the amount of dimer added to the photopolymerizable composition, disregarding the small proportion of dissociation to monomer that occurs.

C. The Free-Radical Generating System

The organic, radiation-sensitive free-radical generating system is one which initiates polymerization of the unsaturated compound and does not subsequently terminate the polymerization. The word "organic" is used here and in the claims to designate compounds which contain carbon, and one or more of oxygen, hydrogen, nitrogen, sulfur and halogen but are free of metal.

The free-radical generating system absorbs radiation within the range of about 2000–8000 Å and has at least one component that has an active radiation absorption band with a molar extinction coefficient of at least about 50 within the range of about 3400–8000 Å, and preferably about 3400–5000 Å. "Active radiation absorption band" means a band of radiation which is active to produce the free radicals necessary to initiate polymerization of the unsaturated material. The free-radical generating system can comprise one or more compounds which directly furnish free radicals when activated by radiation. It can also comprise a plurality of compounds, one of which yields the free radicals after having been caused to do so by a sensitizer which is activated by the radiation.

A large number of such compounds can be utilized in the practice of this invention including aromatic ketones such as benzophenone, Michler's ketone (4,4'-bis(dimethylamino)benzophenone), 4,4'-bis(diethylamino)benzophenone, 4-hydroxy-4'-dimethylaminobenzophenone, 4-hydroxy-4'-diethylaminobenzophenone, 4-acryloxy-4'-dimethylaminobenzophenone, 4-acryloxy-4'-diethylaminobenzophenone, 4-methoxy-4'-dimethylaminobenzophenone, phenanthrenequinone, and other aromatic ketones; benzoin, benzoin ethers such as benzoin methyl ether, benzoin ethyl ether and benzoin phenyl ether, methylbenzoin, ethylbenzoin and other benzoins; 2,4,5-triarylimidazolyl dimers such as 2-(o-chlorophenyl)-4,5-diphenylimidazolyl dimer, 2-(o-chlorophenyl)-4,5-di(m-methoxyphenyl)imidazolyl dimer, 2-(o-fluorophenyl)-4,5-diphenylimidazolyl dimer, 2-(o-methoxyphenyl)-4,5-diphenylimidazolyl dimer, 2-(p-methoxyphenyl)-4,5-diphenylimidazolyl dimer, 2,4-di(p-methoxyphenyl)-5-phenylimidazolyl dimer, 2-(2,4-dimethoxyphenyl)-4,5-diphenylimidazolyl dimer, 2-(p-methylmercaptophenyl)-4,5-diphenylimidazolyl dimer, and the like as disclosed in U.S. Pat. Nos. 3,479,185 and 3,784,557 and in British Pat. Nos. 997,396, published July 7, 1965, and 1,047,569, published Nov. 9, 1966; and bis(p-aminophenyl-$\alpha,\beta$-unsaturated) ketones as described in U.S. Pat. No. 3,652,275.

The imidazolyl dimers may be used with a free-radical producing electron donor such as 2-mercaptobenzoxazole with or without sensitizers such as Michler's ketone and various dyes. Additional examples of suitable initiators are disclosed by Plambeck in U.S. Pat. No. 2,760,863. Redox systems may also be used. These include combinations such as Rose Bengal/2-dibutylaminoethanol; phenanthrenequinone/triethanolamine; 2(o-chlorophenyl)-4,5-di(m-methoxyphenyl)imidazolyl dimer/2-mercaptobenzoxazole; 2(o-chlorophenyl)-4,5-diphenylimidazolyl dimer/2,5-bis(4'-diethylamino-2'-methylbenzylidene)cyclopentanone; and the like.

A preferred group of free-radical generating systems characterized by good efficiency includes methyl, ethyl and phenyl benzoin ethers, methylbenzoin and its ethers, Michler's ketone and its analogs, phenanthrenequinone, phenanthrenequinone/triethanolamine, and 2,4,5-triarylimidazolyl dimers/2-mercaptobenzoxazole. The concentration of the free-radical generating system employed should be about 0.001–5.0 part by weight per part of unsaturated compound, preferably about 0.01–1.0 part by weight.

As is known from the work of Donaruma, J. Org. Chem., 23, 1338 (1958), applied to nitrosocyclohexane dimer, isomerization of nitroso dimers to oximes is catalyzed by acids and bases. When components containing basic amino groups are present in the photopolymerizable composition, it may be necessary to add a suitable acid in an amount sufficient to neutralize all or a portion of these amino groups in order to obtain compositions which have good shelf stability. Such amino-containing components may include the unsaturated compound, any polymeric binder employed, one or more of the components of the free-radical generating system, or any additional components such as plasticizers, adhesion promoters, etc.

For neutralization of these amino groups, it is preferred to employ a mineral or organic acid having a dissociation constant in aqueous solution greater than about $1.3 \times 10^{-5}$. Dissociation constants of organic and inorganic acids in aqueous solutions can be found, e.g., in the "Handbook of Chemistry and Physics", 55th Edition 1974–1975, D129–D130, CRC Press Inc., Cleveland, Ohio. The preferred acid is trifluoroacetic acid because of the good coating characteristics of the resulting compositions.

The amount of acid necessary to provide shelf stability for the composition will depend upon the concentration of the amino groups in the composition. About 0.25 to about 1.0 mole of acid per mole of amino groups is usually satisfactory, and preferably about 0.33 to about 0.67 mole per mole. When reagent grade methylene chloride is employed as a solvent in compositions which are applied to a substrate by coating, it is usually not necessary to add acid since a trace amount of acid is usually present in this solvent.

The photopolymerizable compositions described herein may be applied to a wide variety of substrates. By "substrate" is meant any natural or synthetic support, especially one which is capable of existing in a flexible or rigid film or sheet form. For example, the substrate could be a metal sheet or foil, a sheet or film of synthetic organic resin, cellulose paper, fiberboard, and the like, or a composite of two or more of these materials. Specific substrates include copper, alumina-blasted aluminum, oriented polyester film, alumina-blasted oriented polyester film, polyvinylidene chloride-coated oriented polyester film, polyvinyl alcohol-coated paper, cross-linked polyester-coated paper, nylon, glass, heavy paper such as lithographic paper, polypropylene film and the like.

When the photopolymerizable compositions are applied to metal surfaces, they are useful for making pre-sensitized lithographic printing plates. For example, application of a photopolymerizable layer to a grained aluminum base results in a lithographic printing plate. In use, the developed plate is first coated with water and is then contacted with a roller which wets only the photopolymer image with ink. The inked plate can then be used in lithographic printing in the usual way.

The photopolymerizable compositions can also serve as photoresists in making etched or plated circuits or in chemical milling applications. For example, the photopolymerizable composition may be applied in liquid form to a substrate followed by drying. A removable cover sheet may be applied to the surface of the resultant layer of the composition in order to protect it during handling. Upon removing the cover sheet if present, the dry layer can be laminated to another substrate for its ultimate use, using conventional laminating equipment to apply pressure and generally using heat. The original substrate now becomes a cover sheet. This technique is particularly useful in applying the compositions for use as photoresists, such as described in U.S. Pat. No. 3,469,982, wherein the original substrate is a polymeric film and the substrate to which the layer is transferred generally has a metal or ceramic surface.

The photopolymerizable compositions are also useful for preparing colored images from color separation negatives suitable for color-proofing. The images formed with these elements may also be used for making copies by thermal transfer to a substrate. Specific uses will be evident to those skilled in the art; many uses are disclosed in U.S. Pat. Nos. 2,760,863; 3,060,023; 3,060,026; and 3,469,982.

Processes for applying a layer of photopolymerizable composition either in the liquid or dry state to a substrate are well known. Processes starting with compositions of the substantially dry, predominantly crystalline type are of five general types: those in which (1) the components of the composition are melted together generally forming a homogeneous melt which is coated onto the substrate; (2) the components of the composition are dissolved together in a solvent in which the components are preferably completely soluble and the resulting solution is poured or painted onto the substrate, which is the preferred method; (3) the components of the compositions are dissolved in a volatile solvent and the resulting solution is sprayed as a fine mist against the substrate; (4) the components of the composition are melted together and the melt is sprayed as a fine mist onto the substrate; (5) the components of the composition are mixed together in a heated vessel which contains an inner surface that is cooled in which the distance from the mixture to the cooled surface can be varied whereby the components are sublimed onto the cooled surface. Further details of these processes can be found in the Belgian Patent of Hertler, cited above.

The shelf life of compositions of this invention is greatly extended by incorporation of a nitroso dimer. Similarly, the compositions are stable to elevated temperature exposure and can be subsequently usefully polymerized at temperatures at or near room temperature.

In using the photopolymerizable compositions of the present invention actinic radiation having a wavelength higher than about 3400 Å should be employed to avoid photodissociation of the nitroso dimer and consequent production of undesired inhibitor species. Minor amounts of radiation of wavelength below about 3400 Å may be present. When aromatic nitroso dimers are employed, activating radiation having a wavelength greater than about 3800 Å should be employed to avoid photodissociation of the nitroso dimer. The specific wavelength employed will depend on the particular initiator and sensitizer system employed. Suitable sources of such radiation, in addition to sunlight, include carbon arcs, mercury-vapor arcs, fluorescent lamps with ultraviolet radiation-emitter phosphors, argon glow lamps, electronic flash units and photographic flood lamps. Other fluorescent radiation sources such as the tracings on the face of a cathode ray tube may be used. Electron accelerators and electron beam sources through an appropriate mask may also be used.

Where artificial radiation sources are used, the distance between the photopolymerizable layer and the radiation source may be varied according to the radiation sensitivity of the composition and the nature of the unsaturated compound. Constantly, mercury-vapor arcs are used at a distance of about 1.5–20 inches (3.8–50.8 cm) from the photopolymerizable layer. Radiation fluxes of about 10–10,000 $\mu w/cm^2$ are generally suitable for use.

The length of time the compositions are exposed to radiation may vary upward from a fraction of a second. The exposure times will vary depending on the nature and concentration of the unsaturated compound and the free-radical generating system, and the type of radiation. Exposure temperatures are not particularly critical so long as the equilibrium concentration of nitroso monomer remains at a low level. Hence, temperatures below about 45° C. are used, preferably about 20°–35° C.

Imagewise exposure is conveniently carried out by exposing a layer of the photopolymerizable composition to radiation through a process transparency; that is, an image-bearing transparency consisting solely of areas substantially opaque and substantially transparent to the radiation being used, where the opaque areas are substantially of the same optical density; for example, a so-called line or halftone negative of positive. Process transparencies may be constructed of any suitable materials including cellulose acetate film and polyester film.

The exposed photosensitive layer can be developed be removing the unpolymerized unsaturated compound from the layer, leaving behind a polymeric replica of the original. The unpolymerized unsaturated compound can be removed by heating under conditions which result in some or all of the voltatile components being vaporized whereby the photopolymer is left behind. The conditions of thermal development selected will depend upon the nature of the substrate, the volatility of the components to be removed, and the thermal stability of the components. Alternatively, development may be achieved by solvent washout, thermal transfer, pressure transfer, differential adhesion by which the image is toned with a fine pigment which selectively adheres to the tacky unpolymerized areas, and the like. Preferably, development by solvent washout is used.

The following examples illustrate specific embodiments of the invention. Nitrosocyclohexane dimer, used in Examples 1-3, 5 and 7, is known in the trans form to have an equilibrium constant of $10^{-7}$ and a dissociation half-life of 10 hours in acetonitrile at room temperature (Wajer et al, Rec. Trav. Chim., vol. 91, p 565-577, 1972).

EXAMPLE 1

Thermal Inhibition of Styrene Polymerization by Nitroso Dimers

A stock solution of 2,2'-azobis-(2-methylpropionitrile) (1.0 g) in styrene (140 g) was prepared. This stock solution was divided into three 45-g batches with batch 1 being the control. To batch 2 was added 2.3 g of 1-nitrosooctadecane dimer and to batch 3 was added 0.86 g of nitrosocyclohexane dimer. Aliquots of each batch (10 g) were heated at 80° C. for 2 hr and then poured into methanol. The control (batch 1) afforded 6.5 g of polystyrene. Batches 2 and 3 gave no detectable amount of polystyrene, thereby showing the thermal polymerization inhibiting effect of the nitroso dimer.

EXAMPLE 2

Photopolymerization in the Presence of Nitroso Dimers

A stock solution was prepared as follows:
100 g of triethylene glycol diacrylate, inhibited with 400 ppm butylated hydroxytoluene inhibitor (Ionol®)
50 g of polymethyl methacrylate acrylic resin, inherent viscosity 0.20
50 g of polymethyl methacrylate acrylic resin, inherent viscosity 1.20
2 g phenanthrenequinone and methylene chloride to a total weight of 810 g.

To 40-g aliquots of this stock solution, a butylated hydroxytoluene antioxidant (Ionol®) and selected nitroso dimers were added as follows:
A—No additive
B—0.0512 g of Ionol® (0.5% total weight of solids)
C—0.150 g of Ionol®
D—0.4512 g of Ionol®
E—0.046 g of 1-nitrosododecane dimer
F—0.138 g of 1-nitrosododecane dimer
G—0.414 g of 1-nitrosododecane dimer
H—0.029 g of nitrosocyclohexane dimer
I—0.082 g of nitrosocyclohexane dimer
J—0.241 g of nitrosocyclohexane dimer
K—0.033 g of 2-nitroso-2,4-dimethyl-3-pentanone dimer
L—0.099 g of 2-nitroso-2,4-dimethyl-3-pentanone dimer
M—0.297 g of 2-nitroso-2,4-dimethyl-3-pentanone dimer These samples were coated with a doctor knife (10 mils, 0.0254 cm) onto a polyester film base and after evaporation of the solvent they were covered with another polyester film. These samples were then exposed at room temperature for 2 min. to radiation of wavelength 3650 Å from a mercury resonance lamp at a distance of 4 to 5 in (10.16 to 12.7 cm) through a 21-step $\sqrt{2}$ stepwedge process transparency, in which the transmittance of radiation between steps differs by a factor of $\sqrt{2}$, delaminated and treated with a toner to mark the first step containing unpolymerized monomer. The results obtained are summarized in Table I.

TABLE I

| Sample | First Toned Step | Last Distinguished Step |
|---|---|---|
| A | 10 | 14 |
| B | 10 | 14 |
| C | 10 | 14 |
| D | 9 | 13 |
| E | 12 | 16 |
| F | 11 | 14 |
| G | 4 | 8 |
| H | 10 | 15 |
| I | 9 | 15 |
| J | 6 | 12 |
| K | 10 | 15 |
| L | 9 | 14 |
| M | 8 | 12 |

These results show that nitroso dimers in moderate amounts do not retard photopolymerization, while higher amounts do retard photopolymerization.

EXAMPLE 3

A stock solution was prepared as in Example 2 except that triethylene glycol diacrylate which had been purified by passage twice through a column of neutral alumina to remove any inhibitor that might have been present was employed.

To 40-g aliquots of this stock solution nitroso dimers were added as follows:
A—No additive
B—0.01 g of 1-nitrosododecane dimer
C—0.03 g of 1-nitrosododecane dimer
D—0.09 g of 1-nitrosododecane dimer
E—0.0055 g of nitrosocyclohexane dimer
F—0.0165 g of nitrosocyclohexane dimer
G—0.0495 g of nitrosocyclohexane dimer These samples were coated and exposed as described in Example 2. The results are summarized in Table II.

TABLE II

| Sample | First Toned Step | Last Distinguished Step |
|---|---|---|
| A | 10 | 17 |
| B | 12 | 16 |
| C | 11 | 17 |
| D | 13 | 18 |
| E | 12 | 16 |
| F | 11 | 16 |
| G | 10 | 15 |

Essentially no inhibition of photopolymerization was observed. Hence, satisfactory photopolymerization can be carried out in the presence of nitroso dimers.

EXAMPLE 4

Three 25-ml samples of triethylene glycol diacrylate, purified as described in Example 3, were prepared as follows:
A—No additive
B—400 ppm of Ionol® was added C—400 ppm of 1-nitrosododecane dimer was added The samples were placed in a 100° C. oven and the following results were obtained.

A—Polymerization occurred within 2 hours. No polymer was observed in B and C. The oven was evacuated and the following results were obtained.

B—Gel within 20 hours.

C—No gel after 5 days.

Hence, 1-nitrosododecane dimer is a useful thermal polymerization inhibitor.

EXAMPLE 5

A stock solution was prepared as follows:
1.7025 g of 1,2-diphenoxyethane
0.0491 g of 2-o-chlorophenyl-4,5-bis(m-methoxyphenyl)-imidazolyl dimer
0.0489 g of 2-o-chlorophenyl-4,5-diphenyl imidazolyl dimer
0.0208 g of Michler's ketone
0.0201 g of 2-mercapto-5-t-butylbenzoxazole
0.1815 g of 3(3'-acryloxyphenyl)propionic acid
20 ml of methyl ethyl ketone About 15 drops of this solution were evaporated and crystallized on a 2.5×7.5 cm strip of grained aluminum in yellow light at 90° C. The plate was then exposed at 25° C. through a Kodak 1A ½ transmittance stepwedge process transparency in which the transmittance of radiation between steps differs by a factor of 2, to a medium pressure memory resonance lamp for 17 seconds. The exposed plate was developed by washout with a 91% hexane/9% chloroform solution by immersion in a bath of this solvent mixture. Although some photoimaging was observed, larger particles of polymer formed by thermally initiated poltymerization marred the image.

In a second attempt to prepare a plate at 85° C., thermal polymer was formed during the coating procedure.

A second solution was prepared by dissolving 20 mg of nitrosocyclohexane dimer in 10 ml of acetone. Equal volumes of this solution and the stock solution were mixed and a photopolymer plate coated as described at 85° C. When this plate was exposed to radiation at 25° C. as described and subsequently developed, a photopolymer image was obtained which contained 8 steps and no thermally initiated polymer.

In order to further test the high temperature stability of the nitroso dimer-containing mixture, equal volumes of the stock solution and nitrosocyclohexane dimer solution were evaporated to dryness at 25° C. The solid was melted at 105° C. and the melt used to coat an aluminum plate as described above. The coated plate was irradiated to 25° C. and developed as described to leave a photopolymer image which contained 8 steps and no thermally initiated polymer.

EXAMPLE 6

A stock solution was prepared as follows:
58.0 g cellulose acetate butyrate
70.0 g triethylene glycol diacrylate
1.0 g phenathrenequinone
2.0 g ethylene bis(2-oxyethyl acetate)
diluted to 800 g with 90/10 by volume $CH_2Cl_2/ClCH_2CH_2Cl$.

To portions of the stock solution were added varying quantities of 1-nitrosododecane dimer and these solutions were used to coat oriented polyester films to a thickness of 0.5 mm. The coated films were dried and laminated with an oriented polyester film. The coated films were exposed for 2 minutes at room temperature to radiation of wavelength 3650 Å from a mercury resonance lamp through a 21-step √2 stepwedge and the relative speed of the photopolymerizations determined by dusting with dry toner. The results are summarized in Table III.

TABLE III

| Sample | % 1-Nitrosododecane Dimer based on Solids | Relative Speed |
|---|---|---|
| A | 0.017 | 212 |
| B | 0.043 | 145 |
| C | 0.087 | 145 |
| D | 0.174 | 145 |
| E | 0.43 | 108 |
| F | 0.87 | 70 |
| G | None | 126 |

These results show that small quantities of nitroso dimer give a mild increase in the speed of photopolymerization.

EXAMPLE 7

A stock solution of N-vinylsuccinimide (500 mg) and benzoin methyl ether (25 mg) was prepared by melting the mixture until it was homogeneous. To portions of this mixture (25 g) were added various nitroso dimers. The samples where then photolyzed at room temperature in a photocalorimeter using a radiation source of essentially 3660 Å from a mercury resonance lamp. Under these irradiation conditions an induction period caused by the presence of oxygen was observed before polymerization started. The results are summarized in Table IV.

TABLE IV

| Nitroso Dimer Additive | Conc. (ppm) | Photochemical Induction Period (Sec.) |
|---|---|---|
| None (Control) | — | 22.0 |
| Di-t-butylnitrosomethane dimer | 500 | 23.5 |
| Di-t-butylnitrosomethane dimer | 100 | 20.0 |
| Di-t-butylnitrosomethane dimer | 20 | 24.0 |

Table V summarizes the results of a second set of experiments.

TABLE V

| Nitroso Dimer Additive | Conc. (ppm) | Photochemical Induction Period, (Sec.) |
|---|---|---|
| None (Control) | — | 9.0 |
| Nitrosocyclohexane dimer | 1000 | 8.0 |
| 3,3-Dimethyl-2-nitrosobutane dimer | 1000 | 5.0 |
| 1-Nitrosooctadecane dimer | 1000 | 8.0 |

These results show that selected nitroso dimers actually reduce the photochemical induction period caused by the presence of oxygen.

EXAMPLE 8

Four photopolymerizable compositions were prepared, two as controls, and two containing different concentrations of a nitroso dimer in accordance with this invention. All of the compositions also contained minor amounts of a conventional thermal inhibitor since the polymerizable ethylenically unsaturated compound, as supplied, is so protected against premature thermal polymerization. Control B contained added conventional inhibitor as well. The compositions contained the following ingredients:

| Component | Function |
|---|---|
| Styrene/maleic anhydride copolymer, partially esterified with i-butyl alcohol, acid No. 180, average mol. wt. 20,000, softening point 210° C. | Binder |
| Triethylene glycol diacrylate | Ethylenically Unsaturated Compound |
| 2-Ethylhexyldiphenyl phosphate | Plasticizer |
| 2-Ethylanthraquinone | Free-radical Generating System (Photoinitiator) |
| p-Methoxyphenol (MEHQ) | Conventional Thermal Inhibitor |
| 1,4,4-Trimethyl-2,3-diazabicyclo [3.2.2]-non-2-ene-N,N'-dioxide | Thermal Inhibitor Source |

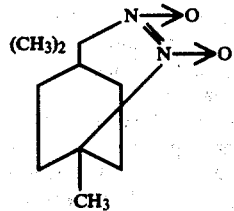

After blending the appropriate ingredients (see Table IV), each composition was separately placed on a rubber mill preheated to 125° C., and milled for about 13 minutes to yield a homogeneous mass. Each mass was then pressed (5 minutes) onto a substrate using a laminating press at 125° C. to yield a photopolymerizable layer or film 0.040 inch (0.10 cm) thick. The substrate was heat-set, biaxially oriented, polyethylene terephthalate, 0.00075-inch-thick (0.002 cm) film, bearing a resin layer, 0.00025-inch-thick (0.0006 cm) to yield improved adhesion; the resin substratum, which had been applied as an aqueous dispersion, was a terpolymer of vinylidene chloride, acrylonitrile, and itaconic acid, in a ratio of 90/10/1. During lamination, furthermore, an electrical-discharge-treated film of polyethylene terephthalate, 0.002-inch-thick (0.0051 cm), was applied as a cover sheet. The resulting four elements were then exposed to a prebackflash exposure followed by the imagewise exposure, as follows.

Each element (with the cover sheet present) was first exposed (backflashed) through the resin-subbed substrate for about 8 seconds at a distance of about 3 inches (7.6 cm) from an array of closely spaced Blacklight tubes (Sylvania Corp., FR48T 12-BL-VHO-180) which served to form a polymerized floor about 0.01 in (0.025 cm) thick and, further, to photocondition the remainder of the photopolymerizable layer.

Next, after removing the cover sheet, a negative test transparency containing line and halftone images was laid on the photopolymerizable layer and an exposure was made through said test image using the above radiation source. The exposure was made while the plate and test image were under 15 inches (38.1 cm) of vacuum in a suitable vacuum frame to hold the test image in intimate contact with the photopolymerizable element. After about 5 minutes exposure, the photopolymerizable element was developed by removing the unexposed areas of the photopolymerized segment by spraywashing the surface for about 3 minutes with an aqueous sodium hydroxide solution (0.03 N) at 115° F. (46° C.), yielding a relief plate consisting of 0.030 inch (0.076 cm) of relief and 0.01 in (0.025 cm) of reinforced floor and polyethylene terephthalate support. This relief plate could then be used to prepare a satisfactory castmetal stereo printing plate by techniques known in the art.

The compositions evaluated in the above process, and the data obtained, are shown in Table VI.

TABLE VI

| PHOTOPOLYMER COMPOSITIONS AND PROPERTIES | | | | |
|---|---|---|---|---|
| Component | Control A | Control B | Example 8A | Example 8B |
| Binder (g) | 67 | 67 | 67 | 67 |
| Ethylenically Unsaturated compound (g) | 22 | 22 | 22 | 22 |
| Plasticizer (g) | 11 | 11 | 11 | 11 |
| Photoinitiator (g) | 0.10 | 0.10 | 0.10 | 0.10 |
| Conventional Thermal Inhibitor (g) | 0.044 | 0.184 (1.48 mmole) | 0.044 | 0.044 |
| Nitroso Dimer (g) | — | — | 0.03 (0.15 mmole) | 0.103 (0.52 mmole) |
| Property Measured | | | | |
| Washout Rate (cm/min) | 0.029$^{(a)}$ | 0.027 | 0.029 | 0.028 |
| Exposure Time$^{(b)}$ (min) | — | 4.5 | 4.0 | 4.0 |
| Polymerization$^{(c)}$ Temperature (°C.) | 130 | 160 | 195 | 200 |

$^{(a)}$Washout was incomplete, inconsistent and nonuniform.
$^{(b)}$The exposure time recorded was the minimum exposure required to hold a 5% dot field using a 65 line/inch screen.
$^{(c)}$The polymerization temperature recorded was the temperature observed at the onset of the exothermic polymerization reaction. This measurement of thermal stability is readily determined by differential scanning calorimetry using a commercial Thermal Analyzer. With this instrument, a small sample (12–14 mg) of the unexposed photopolymerizable composition, under a nitrogen atmosphere, was heated at a rate of 15° C./min. over the range 25°–250° C. Sensitive temperature probes within the test sample traced out on a chart whether the steady temperature rise of the sample was accompanied by an endothermic or exothermic response.

The data of Table VI lead to the following conclusions:

1. Photopolymerizable compositions containing only small quantities of conventional thermal inhibitor (MEHQ, Control A), exhibit poor thermal stability, insufficient stability, in fact, to withstand the temperatures encountered on milling or laminating the sample. This statement was corroborated by experiment; the unexposed element of Control A exhibited uneven washout, indicating some polymerization occurred during milling or in the laminating press.

2. Control B, containing an increased amount of conventional inhibitor (MEHQ), exhibits satisfactory photospeed (exposure time), development (washout rate), and formerly acceptable thermal stability (polymerization temperature).

3. Example 8A, containing a small quantity of a nitroso dimer of this invention exhibits somewhat faster photospeed and development rate than Control B but a marked, significant increase (35° C.) in thermal stability. Example 8B, containing a larger quantity of nitroso dimer, yields still greater thermal stability, with no sacrifice to photospeed or development properties.

The embodiments of the invention in which an exclusive property or privilege is claimed are defined as follows:

1. A thermally stable photopolymerizable composition comprising:
   (i) at least one nongaseous, ethylenically unsaturated compound capable of polymerization by free-radical initiated chain propagation;
   (ii) 20 parts per million to 10% by weight, based on the total weight of the photopolymerizable composition, of a nitroso dimer containing a dinitroso group of the structure

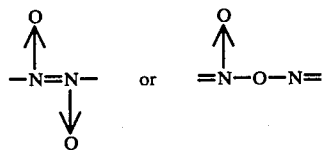

which is a noninhibitor of free-radical polymerization but thermally dissociates to nitroso monomer which is an inhibitor of free-radical polymerization, and is characterized by
   (a) a dissociation constant of $10^{-2}$—$10^{-10}$ in solution at 25° C., and
   (b) a rate of dissociation having a half-life of at least 30 seconds in solution at 25° C.; and (iii) 0.001–5 parts by weight, per part of unsaturated compound, of an organic, radiation-sensitive free-radical generating system activatable by actinic radiation that does not dissociate the nitroso dimer to nitroso monomer.

2. The composition of claim 1 wherein the dinitroso group is of the structure

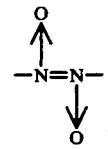

and has a dissociation half-life of at least 1 minute in solution at 25° C.

3. The composition of claim 1 wherein said photopolymerizable composition is of the unsaturated compound/binder type and said nitroso dimer is present in an amount of from 100 parts per million to 2% by weight of said photopolymerizable composition.

4. The composition of claim 3 wherein said nitroso compound is selected from 1-nitrosooctadecane dimer, 1-nitrosododecane dimer, nitrosocyclohexane dimer, di-t-butylnitrosomethane dimer, 3,3-dimethyl-2-nitrosobutane dimer, 2-nitroso-2,4-dimethyl-3-pentanone dimer, and 1,4,4-trimethyl-2,3-diazabicyclo-[3.2.2]-non-2-ene-N,N'-dioxide.

5. The composition of claim 1 wherein said photopolymerizable composition is a substantially dry, predominately crystalline composition employing a normally solid ethylenically unsaturated compound, and said nitroso dimer is present in an amount of 0.1–10% by weight of said composition.

6. The composition of claim 5 wherein said nitroso dimer is nitrosocyclohexane dimer.

7. The composition of claim 4 wherein said nitroso compound is 1,4,4-trimethyl-2,3-diazabicyclo[3.2.2]-non-2-ene-N,N'-dioxide.

8. The composition of claim 1 wherein said photopolymerizable composition is of the unsaturated compound/binder type.